United States Patent [19]
Hikmet

[11] Patent Number: 5,359,253
[45] Date of Patent: Oct. 25, 1994

[54] PIEZOELECTRIC MATERIAL COMPRISING A POLYMER NETWORK

[75] Inventor: Rifat A. M. Hikmet, Eindhoven, Netherlands

[73] Assignee: U.S. Philips Corporation, New York, N.Y.

[21] Appl. No.: 36,772

[22] Filed: Mar. 25, 1993

[30] Foreign Application Priority Data

Mar. 27, 1992 [EP] European Pat. Off. ........ 92200874.3

[51] Int. Cl.$^5$ .......................................... H01L 41/08
[52] U.S. Cl. .................................. 310/357; 310/800; 264/22; 428/421; 428/422; 425/174.6
[58] Field of Search .............. 310/311, 357, 358, 800; 29/25.35; 361/233; 427/100; 264/22, 24; 428/42, 922; 425/174, 174.8 R, 174.6; 558/199; 528/399; 204/59 R, 155

[56] References Cited

U.S. PATENT DOCUMENTS

| | | | |
|---|---|---|---|
| 4,875,378 | 10/1989 | Yamazaki et al. | 310/338 |
| 4,877,988 | 10/1989 | McGinniss | 310/357 X |
| 4,933,479 | 6/1990 | Kotaka et al. | 310/800 X |
| 5,105,116 | 4/1992 | Okamoto et al. | 310/311 |
| 5,187,402 | 2/1993 | Fujita et al. | 310/357 X |

FOREIGN PATENT DOCUMENTS

0261712 3/1988 European Pat. Off. .
0293911 12/1988 European Pat. Off. .
1-113728 5/1989 Japan .
1-296216 11/1989 Japan .

OTHER PUBLICATIONS

"Experimental Proof of Piezoelectricity in Cholesteric and Chiral Smectic C*-Phases of LC-Elastomers" Vallerien et al, Makromol. Chem., Rapid Commun. 11, pp. 593-598 (1990).

"Piezoelectric Effects in Liquid Crystals" R. B. Mayer in Phys. Rev. Lett. 22 (18), pp. 918-921.

H. Stegemeyer et al, Liquid Crystals 10 (3) pp. 295-310 (1991).

Y. Yamada et al, Jap. 2. Appl. Physics 29 (9) pp. 1957-1964.

*Primary Examiner*—Mark O. Budd
*Attorney, Agent, or Firm*—Norman N. Spain

[57] ABSTRACT

The invention relates to a piezoelectric element comprising a piezoelectric material 1, in the form of a polymer network, between at least two electrodes 2, 3. The piezoelectric material is formed from a starting material comprising a liquid crystalline monomeric material and a chiral compound. The starting material is brought to a temperature at which a smectic phase is formed, and an electric field is applied to obtain a dipolar orientation in the starting material, after which the polymer network is formed by means of photopolymerisation. The piezoelectric element thus manufactured can suitably be used for various electromechanical applications, as a sensor material, for pyroelectric applications and, in particular, also for optical applications.

5 Claims, 4 Drawing Sheets

PIEZOELECTRIC MATERIAL COMPRISING A POLYMER NETWORK

BACKGROUND OF THE INVENTION

The invention relates to a piezoelectric material comprising a chiral compound and a polymer network having a smectic structure.

The invention also relates to a piezoelectric element comprising a piezoelectric material positioned between at least two electrodes, said piezoelectric material comprising a chiral compound and a polymer network having a smectic structure.

The invention further relates to a method of manufacturing a piezoelectric material by forming a polymer network from a starting material which comprises a liquid crystalline monomer material and a chiral compound.

Piezoelectric materials, in particular also synthetic resins such as polymeric materials, are suitable for use in many applications, such as in electromechanical components, generators and sensors, for example in microphones and speakers. Besides, use can be made of the pyroelectric effect and, in the ease of transparent materials, also of nonlinear optical properties.

The manufacture of a piezoelectric elastomer material is described by S. U. Vallerien et. al., in Makromol. Chem., Rapid Commun. 11, on pages 593-598 (1990). In this publication, polymers having mesogenic groups are mixed with a chiral compound to obtain spontaneous polarization in the polymeric material, after which the material is converted to an elastomer by means of thermal crosslinking from an isotropic phase. The resulting material may exhibit cholesteric and/or chiral smectic phases and ferroelectric properties in a multi-domain structure. If desired, an improved molecular orientation can be obtained by orienting the polymer molecules in a magnetic field during crosslinking.

The known material has the disadvantage that the piezoelectric effect is small, in particular, when a cholesteric phase is used. This is caused by the presence of a multi-domain structure as a result of which not all dipoles in the material are equally oriented, and by the fact that the mesogenic groups are partly situated in side chains of the polymer molecules, which is not very effective for obtaining a piezoelectric effect. In addition, the known material exhibits various phase transitions, so that the applicability is limited to narrow temperature ranges and the stability of a piezoelectric element manufactured with this known material is insufficient. Also the known method of manufacturing the piezoelectric material by thermally activating the crosslinking between the polymeric molecules causes any orientation of the molecules to be lost and leads to the formation of a loose network having a limited stability.

SUMMARY OF THE INVENTION

It is an object of the invention to provide, inter alia, a piezoelectric material and a piezoelectric element having a piezoelectric effect of technically usable magnitude. A further object of the invention is to provide a material and an element which can be used in a wide temperature range. The stability of the material and the element should be such that, even at an increased temperature, said material and said element can make use, if desired, of the pyroelectric effect. For this purpose it is a goal of the invention to provide a piezoelectric material having no phase transitions in the intended working temperature range.

A further goal of the invention is to provide a simple and reproducible method of manufacturing a stable piezoelectric material.

According to one aspect of the invention these objects are achieved by a new and novel piezoelectric material having permanently oriented dipoles and comprising a chiral compound and an anisotropic polymer networks having a semectic structure and by a piezoelectric element comprising such a piezoelectric material.

DETAILED DESCRIPTION OF THE INVENTION

Figure 1:
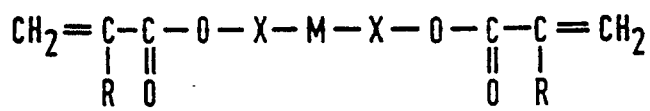
FIG. 1 shows structural formulae of monomers suitable for forming a polymer networks according to the invention.
Figure 1:
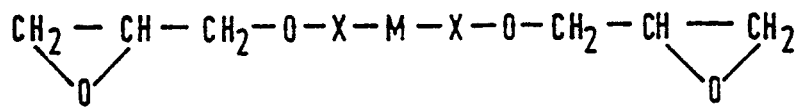
Figure 1:
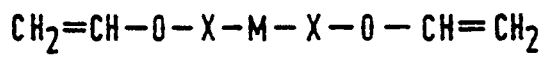
Figure 1:
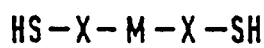
Figure 1:
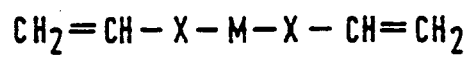

According to another aspect of the invention, the object of providing a method of manufacturing a piezoelectric material is achieved by a method in which the starting material is brought to a temperature at which a smectic phase is formed, and an electric field is applied to obtain a dipolar orientation in the starting material, after which the polymer network is formed by means of photopolymerisation.

In a preferred embodiment of the method according to the invention, the monomeric material is a di(meth)acrylate compound.

In a preferred embodiment a very stable piezoelectric material is obtained when the polymer network consists of poly (meth) acrylate chains having mesogenic groups in the crosslinks of the networks.

Unlike the known elastomeric materials which are obtained by randomly crosslinking polymer chains, the piezoelectric material according to the invention, which is obtained by photopolymerisation of ordered monomers, forms a stable network. Unlike an anisotropic network, the known elastomeric materials exhibit no microscopic orientation in the absence of mechanical deformation.

The presence of a chiral compound in a material having a smectic structure may cause spontaneous polarization with a multi-domain structure. According to the invention, a single-domain structure can be obtained in an effective manner by applying an electric field, which also causes dipoles to be oriented in the smectic layers. Subsequently, the dipolar orientation is fixed by forming a stable network. In contrast, a magnetic field has, dependent upon the polarizability of the molecules, an orienting effect on the molecules.

The use of a photopolymerisation process to manufacture the piezoelectric material according to the invention precludes the occurrence of phase transitions and structure changes during polymerisation. The material manufactured exhibits no phase transitions over a substantial temperature range, which is important for, in particular, pyroelectric applications.

The piezoelectric material according to the invention can suitably be manufactured in the form of, in particular, a thin layer, which layer can be provided in accordance with a desired pattern. Both the orientation process (the polarization) and the formation of the network (by polymerisation) can be carried out according to any desired pattern.

The basic thought on which the invention is based can be generalized as follows: a material containing spontaneously polarized dipoles is selected and subjected to an electric field such that a single domain structure is formed, which structure is then fixed by forming a stable network by means of a method which does not disturb the structure, in particular photopolymerisation. Suitable starting materials are ferroelectric materials, for example having a chiral smectic structure, see for example H. Stegemeyer et. al. in Liquid Crystals 10 (3), pages 295–310 (1991), anti-ferroelectric materials, see Y. Yamada et. al. in Jap. J. Appl. Physics 29 (9), pages 1757–1764 (1990) or flexoelectric systems, for example, as described by R. B. Meyer in Phys. Rev. Lett.22 (18), pages 918–921 (1969).

In the published Japanese Patent Application JP 1-296216, a pyro-piezoelectric element of a polymeric material having liquid crystalline properties, applications of such an element and a method of manufacturing such an element are described. The piezoelectric material is obtained by cooling a ferroelectric polymer from the isotropic phase in an electric field in which a dipolar orientation is brought about. The starting material may be, for example, a polymer which exhibits a chiral smectic phase at the desired working temperature. However, the resulting material does not form an (anisotropic) polymer network, is mechanically weak, not very stable and loses its orientation when the temperature is increased.

In European Patent Application EP 293911, a description is given of an elastomeric material having liquid crystalline properties which is provided on a supporting material. The polymeric molecules are oriented by means of mechanical deformation, before or after crosslinking the molecules, so that the reaction to the application of a magnetic or electric field is increased. In such a material the dipoles are not (permanently) oriented. The material also exhibits phase transitions, which are important for the applications described (storage and reproduction of data), but which are undesirable for a stable piezoelectric element.

The invention will be explained in greater detail by means of an exemplary embodiment and the figures of the drawing.

Figure 2:
FIG. 2 shows structural formulae of examples of the group X.
Figure 2:
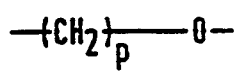
Figure 2:
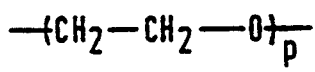
Figure 2:
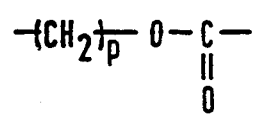
Figure 2:
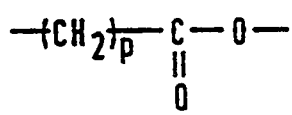
Figure 2:
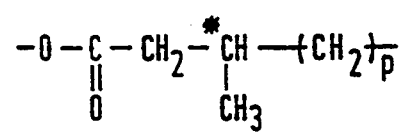
Figure 2:
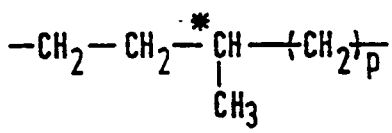
Figure 3:
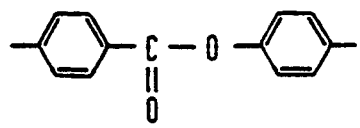
FIG. 3 shows structural formulae examples of the group M.
Figure 3:
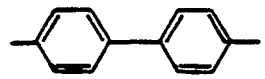
Figure 3:
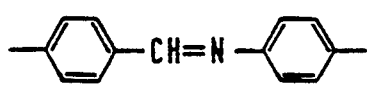
Figure 3:
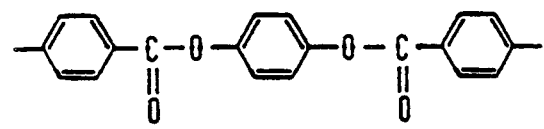

FIG. 1 shows structural formulae a number of monomers which can suitably be used for the manufacture of polymer networks for use in a piezoelectric material and piezoelectric element according to the invention. Suitable monomers are, inter alia, acrylate compounds (the group —R is a hydrogen atom), methacrylate compounds (the group —R is a methyl group), chloroacrylate compounds (the group —R is a chlorine atom), epoxy compounds and vinyl ether compounds. Examples of the group —X— are shown in FIG. 2, where the value of p may range from 1 to approximately 12. Examples of the group —M— are shown in FIG. 3. To form a polymer network by means of photopolymerisation, use can be made of a photosensitive initiator which can be selected, in known manner, to suit the character of the monomer. Aromatic carbonyl compounds are suitable photosensitive initiators for forming a network of di(meth)acrylate compounds; to form a network of epoxy compounds and vinyl ether compounds use can be made of diaryl iodonium compounds such as diphenyl iodonium and hexafluoroarsenide.

Figure 4:
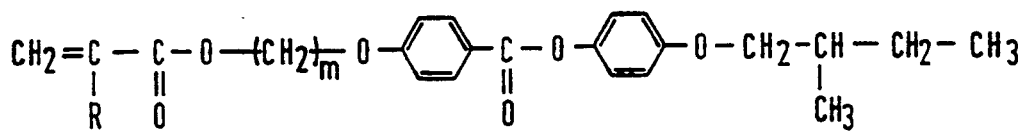
FIGS. 4 and 5 show structural formulae of examples of co-reacting and non-co-reacting chiral compounds, respectively which can suitably be incorporated into the polymer networks according to the invention.
Figure 4:
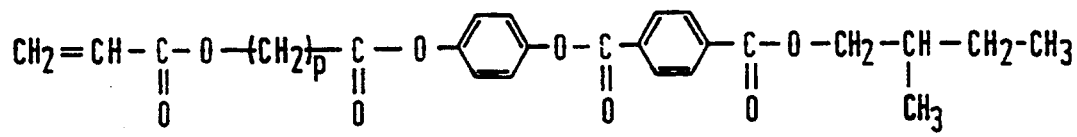
Figure 4:
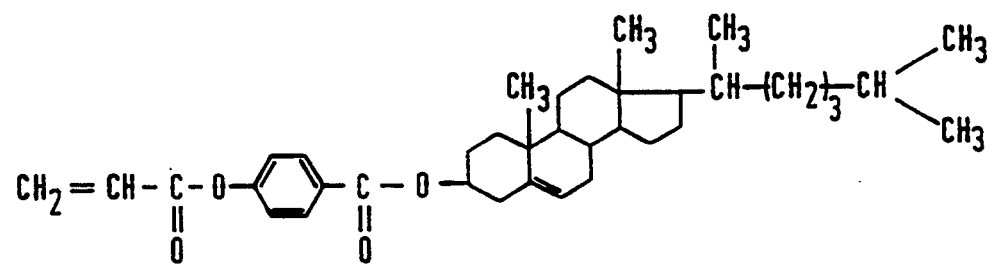
Figure 4:
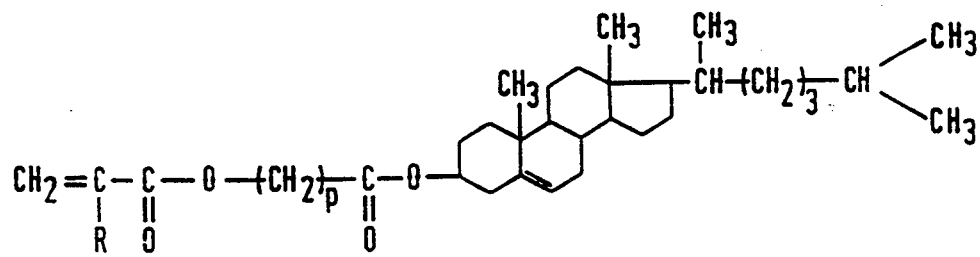
Figure 4:
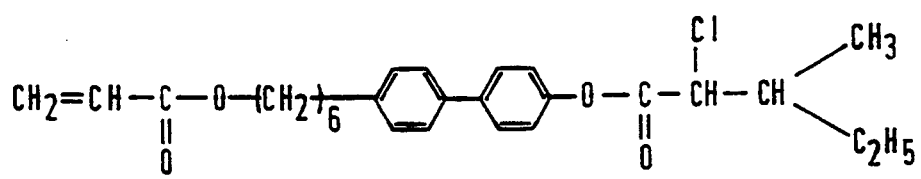
Figure 4:
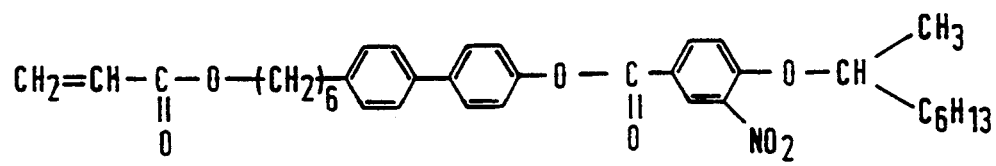
Figure 5:
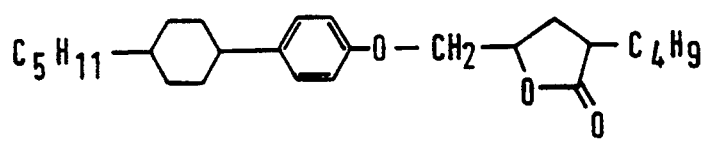
Figure 5:
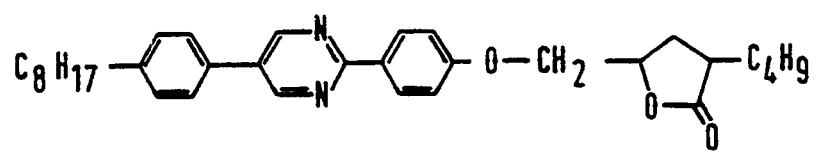
Figure 5:
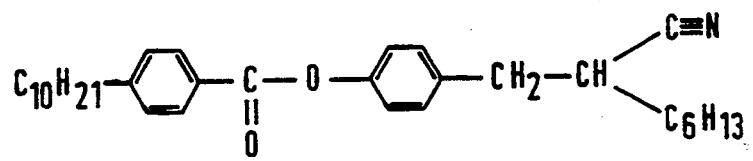
Figure 5:
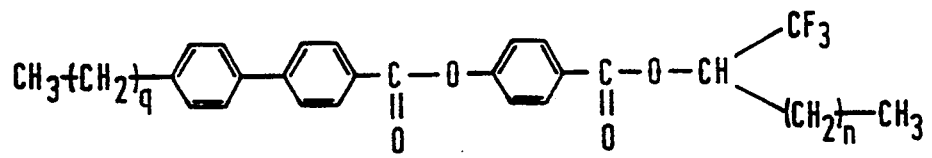

FIG. 4 shows structural formulae a number of chiral compounds which can bring about spontaneous polarization in a polymer network and which can also suitably be incorporated into the network by means of co-polymerisation. In the formulae, the value of m ranges from 2 to approximately 15 and the value of p ranges from 1 to approximately 12. FIG. 5 shows a number of suitable alternative chiral compounds which do not co-react during photopolymerisation. In the formulae, the value of n ranges from 4 to 8 and the value of q ranges from 6 to 12.

If desired, compounds having donor-acceptor groups or hyperpolarizable compounds may be added to the piezoelectric material according to the invention, for example to provide the material with nonlinear optical properties. Such compounds can be selected in such a manner that they can suitably be incorporated into the network by means of co-polymerisation.

EXEMPLARY EMBODIMENT

Figure 6A:
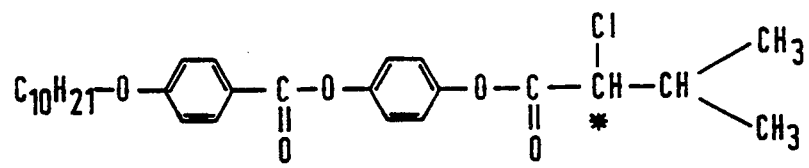
FIG. 6 shows the structural formulae of the constituents of an exemplary embodiment of a piezoelectric material according to the invention.
Figure 6B:
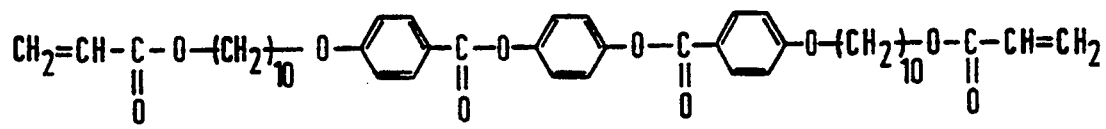

A mixture of liquid crystalline materials was prepared from 15 % by weight of the chiral compound having the composition shown in FIG. 6a (available from Aldrich), to which 84% by weight of a monomeric diacrylate compound having the composition shown in FIG. 6b (to be manufactured, for example, by the method described in the European Patent Application EP 261712), and 1% by weight of the photosensitive initiator 2,2-dimethoxy-2-phenyl-acetophenone (available from CibaGeigy) was added. This mixture has a smectic structure and exhibits ferroelectric properties at temperatures between 80° C. and 96° C. At temperatures above 96° C., a chiral nematic (cholesteric) phase is formed which changes to an isotropic phase at a temperature of 126° C. At 80° C, the spontaneous polarization is 10 nC/cm$^2$.

A 60 μm thick layer of said mixture was placed in a DC electric field having a strength of 0.33 MV/m and was subsequently cured by exposure, for several minutes, to UV light, using a high-pressure mercury discharge lamp having an intensity of 10 mW/cm$^2$ at a wavelength of 366 nm. The material obtained is optically transparent, mechanically strong and flexible.

The material obtained exhibits a piezoelectric effect and has a piezoelectric constant of 3.1 pC/N in the direction of orientation of the dipoles (the direction of the field applied during photopolymerisation) and of 1.4 pC/N in the directions perpendicularly thereto. For comparison: the piezoelectric constant of a number of known materials, expressed in pC/N:

polyvinyl fluoride1
polyvinylidene fluoride28
quartz2.4
barium timate190.

In the case of crystalline polymers such as polyvinyl fluoride and polyvinylidene fluoride, however, the piezoelectric effect depends very much on the degree of crystallinity and, hence, on the preparation method, as a result of which the reproducibility is insufficient. Crystalline polymers, crystalline materials such as quartz and ceramic materials such as barium titanate are generally little flexible and not very suitable for use in the form of thin layers, and, in addition, the possibilities of shaping the desired product are limited. Besides, the known materials are generally not transparent and, hence, not suitable for optical applications.

Figure 7:
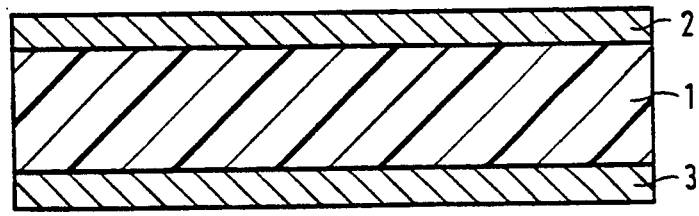
FIG. 7 is a diagrammatic cross-sectional view of a piezoelectric element.

FIG. 7 diagrammatically shows a piezoelectric element comprising a piezoelectric material 1 between two electrodes 2, 3. If desired, a piezoelectric element can be composed of a stack of such elements. If necessary, a light-absorbing or heat-absorbing layer can be incorporated for pyroelectric applications. A piezoelectric element according to the invention can be used for optical purposes by using an optically transparent material such as poly(meth)acrylate compounds in accordance with the invention in combination with one or more transparent electrodes, for example, of indium oxide/tin oxide. When a piezoelectric material having nonlinear optical properties is used, such an element can be utilized, for example, for doubling the frequency of light by generating second harmonic vibrations or in an optical switch such as a Pockels cell.

The invention provides a piezoelectric material which can be used in a piezoelectric and/or pyroelectric element and which can be produced in many shapes in a simple manner, has stable properties and can suitably be used for optical applications.

I claim:

1. A piezoelectric material comprising a chiral compound and an anisotropic polymer network having a smectic structure, characterized in that the piezoelectric material has permanently oriented dipoles.

2. A piezoelectric material as claimed in claim 1, characterized in that the polymer network consists of poly(meth)acrylate chains having mesogenic groups in the crosslinks of the network.

3. A piezoelectric element having a piezoelectric material between at least two electrodes, said piezoelectric material comprising a chiral compound and an anisotropic polymer network having a smectic structure, characterized in that the polymer network has permanently oriented dipoles.

4. A method of manufacturing a piezoelectric material by forming an anisotropic polymer network from a starting material comprising a liquid crystalline monomeric material and a chiral compound, characterized in that the starting material is brought to a temperature at which a smectic phase is formed, and an electric field is applied to obtain a dipolar orientation in the starting material, after which the polymer network is formed by photopolymerisation.

5. A method as claimed in claim 4, characterized in that the monomeric material is a di(meth)acrylate compound.

* * * * *